United States Patent
Balasubramanian et al.

(10) Patent No.: US 12,313,681 B2
(45) Date of Patent: May 27, 2025

(54) IDENTIFYING DEFECT SENSITIVE CODES FOR TESTING DEVICES WITH INPUT OR OUTPUT CODE

(71) Applicant: Texas Instruments Incorporated, Dallas, TX (US)

(72) Inventors: Lakshmanan Balasubramanian, Bengaluru (IN); Nadeem Husain Tehsildar, Bengaluru (IN); Rubin Ajit Parekhji, Bengaluru (IN); Suresh Mallala, Hyderbad (IN); Nitin Agarwal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1441 days.

(21) Appl. No.: 16/538,518

(22) Filed: Aug. 12, 2019

(65) Prior Publication Data
US 2020/0057106 A1  Feb. 20, 2020

Related U.S. Application Data

(60) Provisional application No. 62/718,792, filed on Aug. 14, 2018.

(51) Int. Cl.
*G06F 30/30* (2020.01)
*G01R 31/3167* (2006.01)
(Continued)

(52) U.S. Cl.
CPC . *G01R 31/318357* (2013.01); *G01R 31/3167* (2013.01); *G01R 31/31835* (2013.01);
(Continued)

(58) Field of Classification Search
CPC ........ G01R 31/318357; G01R 31/3167; G01R 31/31835; G06F 30/20; G06F 30/333;
(Continued)

(56) References Cited

U.S. PATENT DOCUMENTS 7,710,302 B2 *  5/2010  Iadanza ................... H03M 1/06
                                                341/145
8,108,728 B2 *  1/2012  Das ..................... G06F 30/3323
                                                714/29
(Continued)

OTHER PUBLICATIONS

Analog Fault Simulation: Practical Applications, Case Studies and Challenges; Rubin Parekhji, Devanathan Varadarajan, Lakshmanan Balasubramanian, Kenneth M. Butler; 2018 International Test Conference, Dallas, TX, Oct. 31, 2018.

*Primary Examiner* — Jack Chiang
*Assistant Examiner* — Brandon Bowers
(74) *Attorney, Agent, or Firm* — Ronald O. Neerings; Frank D. Cimino (57) ABSTRACT

In one embodiment, a method of operating a computational system to evaluate a device under test, where the device under test is operable to receive a digital code input and output in response a corresponding output. The method injects a plurality of simulated faults into a pre-silicon model of the device under test. For each injected simulated fault, the method inputs a plurality of digital codes to the model. For each input digital code, the method selectively stores the input digital code if a difference, between a corresponding output for the input digital code and a no-fault output for the input, exceeds a predetermined threshold value.

28 Claims, 4 Drawing Sheets

(51) Int. Cl.
   *G01R 31/3183* (2006.01)
   *G06F 30/20* (2020.01)
   *H03M 1/10* (2006.01)
   *G06F 30/333* (2020.01)

(52) U.S. Cl.
   CPC .......... *G06F 30/20* (2020.01); *H03M 1/1071* (2013.01); *G06F 30/333* (2020.01)

(58) Field of Classification Search
   CPC ... H03M 1/1071; H03M 1/468; H03M 1/1076
   See application file for complete search history.

(56) References Cited

U.S. PATENT DOCUMENTS

| | | | |
|---|---|---|---|
| 8,166,445 B1* | 4/2012 | Chen | G06F 30/367 |
| | | | 716/108 |
| 9,813,071 B1* | 11/2017 | An | H03M 1/0617 |
| 10,346,273 B2* | 7/2019 | Fricano | G01R 31/2846 |
| 2010/0229061 A1* | 9/2010 | Hapke | G01R 31/318342 |
| | | | 714/740 |
| 2019/0034566 A1* | 1/2019 | Ting | G06F 30/367 |

* cited by examiner

| TEST | DETECTION COVERAGE (SAR ANALOG) | DETECTION COVERAGE (CAP ARRAY) | DETECTION COVERAGE (TOTAL) |
|---|---|---|---|
| CONVENTIONAL HISTOGRAM TEST (ALL CODES) | 32.44% (97/299) | 68.42% (52/76) | 39.73% (149/375) |
| TEST USING ALTERNATE CODES (SEVEN CODES) | 31.44% (94/299) 5 CODES | 68.42% (52/76) 2 CODES | 38.93% (146/375) 7 CODES |

FIG. 5

IDENTIFYING DEFECT SENSITIVE CODES FOR TESTING DEVICES WITH INPUT OR OUTPUT CODE

CROSS-REFERENCE TO RELATED APPLICATION

This application claims priority to, the benefit of the filing date of, and hereby incorporates herein by reference: U.S. Provisional Patent Application No. 62/718,792, entitled "Method for Automatic Identification of Defect Sensitive Codes for Analog to Digital Converter Test," filed Aug. 14, 2018.

BACKGROUND

The example embodiments relate to a device under test (DUT), or portion thereof, the DUT having an input or output code set.

Pre-silicon verification testing, sometimes referred to as pre-silicon verification, evaluates the design model of a device under test (DUT). The DUT may be as an integrated circuit (IC), multiple such integrated circuits (ICs), or systems including one or more ICs, in a computerized virtual environment before the device(s) has been fabricated (e.g., in silicon). The goal of pre-silicon verification is to verify operational attributes of the DUT, for example including functional correctness and performance Pre-silicon verification uses various sophisticated virtual environment tools, such as simulation and emulation to apply input stimuli used to mimic conditions within, or beyond, specification. Additionally, part of pre-silicon verification, or following it, also may identify test conditions based on attributes of the design that are prone to defects, referred to as defect-sensitive test conditions, where these test conditions are then translated into test criteria for post-silicon application.

A DUT may be one of many different IC devices. A pertinent DUT type for later-described embodiments is a device that operates with a digital code set made up of binary values. In some ICs, the digital values of the code set are used for DUT inputs that then produce counterpart analog outputs. In other ICs, the digital values are produced as DUT outputs that are counterparts to analog DUT inputs. In other words, the DUT, meaning an entire device or system, or a portion thereof, inputs a signal (e.g., voltage, frequency, current, delay, temperature, or pressure) and outputs a corresponding code from a set of codes, or in opposite fashion inputs a code from a set of codes, and outputs a corresponding signal. One example is an analog-to-digital converter (ADC), when an entire device is an ADC or the ADC is a functional portion of a larger device or tested system. Both pre-silicon validation, and post-silicon testing, of an ADC often includes a histogram-based full linearity test. This test simulates the application of a linearly changing (e.g., increasing) input voltage to the ADC DUT and stores the resultant digital output codes from the DUT. In an ideal ADC, the value of the digital output code should be predictable, based on the magnitude of the input analog voltage. For example, consider an N-bit (e.g., 12-bit) ADC which, therefore, can output any of $2^N$ (e.g., $2^{12}$=4,096) output codes. Accordingly, within the allowable input voltage span, there would be expected $2^N$ different ranges, where for each different input range a different corresponding expected output code is anticipated. In testing the DUT, therefore, an exhaustive manner of testing simulates or delivers a linearly increasing analog voltage to pass through, or otherwise provide, a voltage for each of the $2^N$ input ranges, so as to output from the DUT each of a respective $2^N$ digital output codes. If the actual digital output code matches the expected digital output code, the DUT is operationally verified or tested for the corresponding input voltage; if a mismatch occurs, there is a defect in the DUT. Further, typical testing repeats the conversion a considerable number R of times per range (or corresponding expected output code), for example for averaging to suppress other random noise components so as to measure the resolution accuracy. With this process, the number of testing voltage incidents can be very high and consequently very time consuming. For the above example of a 12-bit ADC, assume the repeat number R=300; accordingly, the number of conversions is $2^N*R$, which in the example provided is 4,096*300 resulting in approximately 1.23 million conversions. Moreover, such testing becomes increasingly complex for analog integrated devices in mixed signal circuits and systems, including with respect to the embedded nature, test time restrictions, automatic test equipment (ATE) constraints, and the like. Lastly, other considerations may apply to other data converters, where such converters include either an input or output code set.

Accordingly, example embodiments are provided in this document that may improve on certain of the above concepts, as further detailed below.

SUMMARY

One embodiment provides a method of operating a computational system to evaluate a device under test, where the device under test is operable to receive a digital code input and output in response to a corresponding output. The method injects a plurality of simulated faults into a pre-silicon model of the device under test. For each injected simulated fault, the method inputs a plurality of digital codes to the model. For each input digital code, the method selectively stores the input digital code if a difference, between a corresponding output for the input digital code and a no-fault output for the input digital code, exceeds a predetermined threshold value.

Another embodiment provides a method of operating a computational system to evaluate a device under test, where the device under test is operable with respect to receive an analog value input and output in response a digital code from among a set of digital codes. The method injects a plurality of simulated faults into a pre-silicon model of the device under test. For each injected simulated fault, the method inputs a plurality of analog values to the pre-silicon model of the device under test. For each input analog value, the method selectively stores a representation of the input value if a difference, between a corresponding digital code output for the input analog value and a no-fault digital code output for the input analog value, exceeds a predetermined threshold value.

Other embodiments and aspects are also disclosed and claimed.

DETAILED DESCRIPTION

IC design and evaluation can be critically practical applications during pre-silicon IC design testing and in post-silicon IC testing. As one example, in pre-silicon validation, test conditions are ascertained and applied to the device design. This validation can reveal aspects that require change, alteration, or adjustment, to ultimately improve the final design to be used in silicon (or other semiconductor) manufacture. The improved design is less vulnerable to manufacturing and/or operational error. As another example, in IC manufacture (post-silicon), an IC designer/manufacturer typically has certain yield requirements, guided by market considerations and user needs/expectations. Accordingly, tests on either a sample of ICs or all ICs are performed using various techniques and/or apparatus. Such testing predicts post-manufacture behavior of the IC. Without such testing, an improperly tested circuit can initially, periodically, or after long term usage, fail to perform, in which case the user(s) of the IC, or a system that relies on the IC, may be subject to the consequences of the performance failure.

Example embodiments are directed to the practical application of the above-introduced validating and testing of ICs, particularly to ICs having, either as a whole or portion thereof, either an input or output code set. For example, one application of the example embodiments is an analog-to-digital converter (ADC), either as a standalone device or as part of an IC (or the IC design). For such an ADC, as a DUT, and with an N-bit output, the total code set of an integer number TCS possible expected output codes consists of $TCS=2^N$ output codes. Under traditional linear post-silicon ADC testing, if the device design is proper, then all TCS output codes will be generated across a full linear input voltage swing, that is, from the input minimum to the input maximum (or vice versa). Comparably, if the DUT is a digital-to-analog converter (DAC) designed to produce $2^N$ different analog output values, under traditional linear post-silicon DAC testing then each of the different $TCS=2^N$ inputs codes is sequentially input to the device (e.g., monotonically ascending or descending among the codes), in which case if the design and manufacture is correct the DAC will output an approximately linearly changing (or step function) output voltage (or other condition if the digital-to-analog conversion is of a different output type—e.g., current, frequency, delay, temperature, pressure, and any other sensory parameters whose measurement lends itself to a choice of analog values and/or digital codes.)

In contrast to full linear testing, example embodiments facilitate post-silicon testing based on a code set having less than $2^N$ values. Specifically, in the pre-silicon stage, example embodiments identify a subset of an integer number of STCS of the TCS codes in the full code set. The subset of STCS codes in not only less than, but may be possibly even at least one order of magnitude less than, the number $TCS=2^N$ of codes in the full code set. For a digital-to-analog converter circuit, the pre-silicon identified subset of STCS codes may be used as inputs for post-silicon testing of that digital-to-analog converter circuit. For an analog-to-digital converter circuit, the pre-silicon subset of STCS codes may be identified along with a counterpart set of respective STCS analog values, and the respective STCS analog values may be used as inputs for post-silicon testing of that analog-to-digital converter circuit. Accordingly, once the STCS codes and/or respective number of STCS analog values are determined at the pre-silicon stage, example embodiments may test the DUT in the post-silicon manufactured form in far less time and more efficiently as compared to a conventional histogram linear test which endeavors to test at all TCS linear input (or output) voltages (or other signals, such as frequency, delay, temperature, pressure, etc.).

Figure 1:
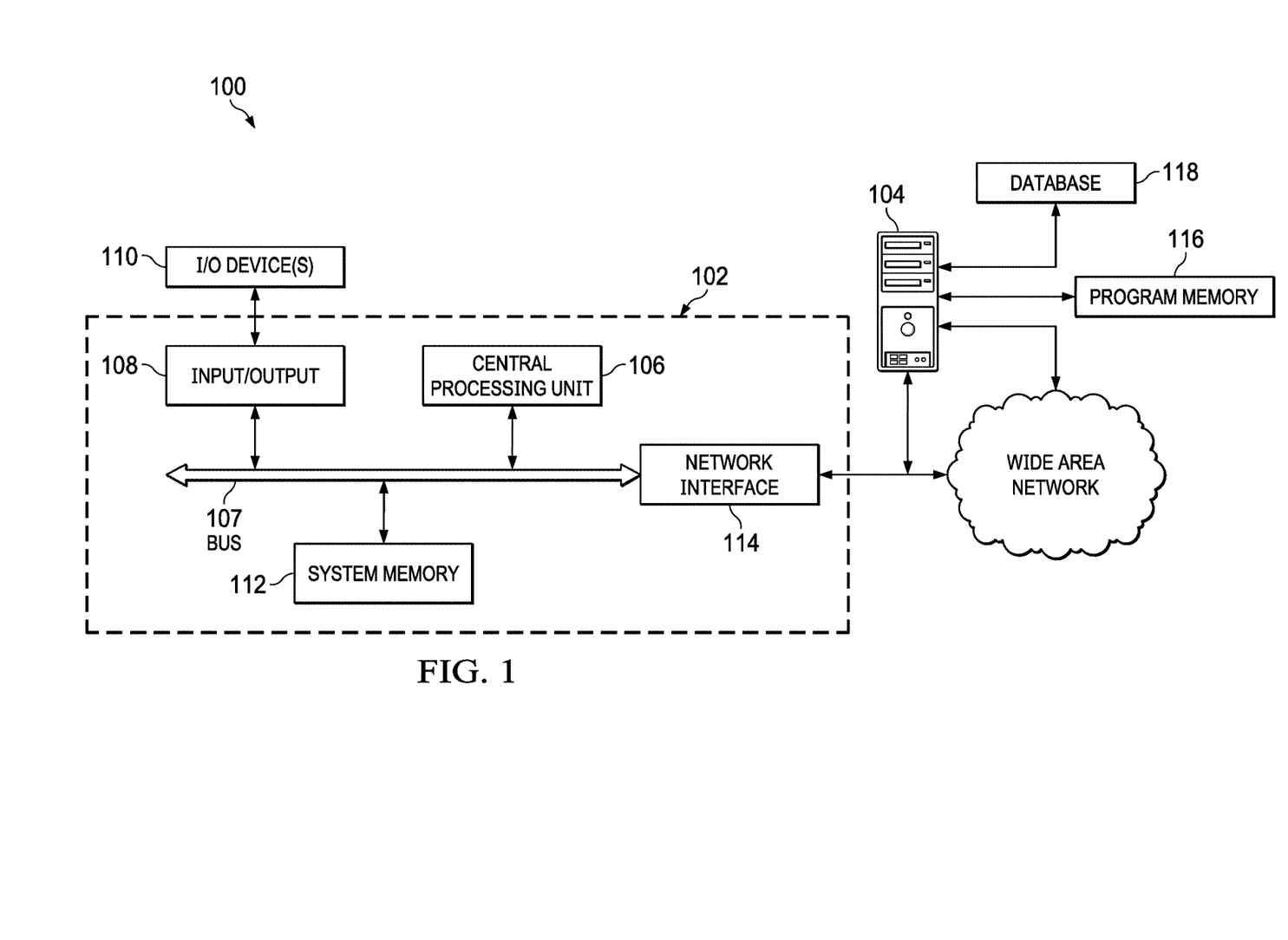
FIG. 1 illustrates an example implementation of a computational system for pre-silicon testing of a DUT.

FIG. 1 illustrates an example embodiment of a computational system 100, as a form of automated test equipment (ATE). Specifically, example embodiments include tools and techniques that are contemplated as implemented, at least in part, by system 100 for pre-silicon verification testing, including pre-silicon test condition identification of a DUT, where also contemplated is using the identified test conditions (codes or analog values) for post-silicon test application. System 100 thereby receives programming and thereby facilitates the calculations, operations, and steps intended to efficiently identify the subset STCS of codes (and each counterpart testing analog value corresponding to those codes). In this example, system 100 may be realized by way of a computing system 102 connected to a server 104 by way of a network, where the network may be one of various networks, including a wide area network such as the global internet. In this sense, computing system 102 may be a local device that communicates with the internet, and where server 104 and its related architecture and software are hosted on another network accessible station or node. Of course, the particular architecture of a computer system useful in connection with the example embodiments may vary widely. For example, computing system 102 may be realized by a single personal computing device, such as a conventional workstation, personal computer, or alternatively by a computer system implemented in a distributed manner over multiple physical computers. Accordingly, the generalized architecture illustrated in FIG. 1 is provided by way of example.

With more detail as to computing system 102, it includes a central processing unit (CPU) 106, coupled to a system bus 107. Also coupled to system bus 107 is an input/output (I/O) interface 108, which communicates with peripheral I/O devices 110 by which a user may input or receive information provided to or from computing system 102. Peripheral I/O devices 110 may include one or more of various devices, such as a keyboard, display, camera, microphone, scanner, media reader, speaker, buttons, touch screen, printer or printer communications, or the like. CPU 106 refers to the data processing capability of computing system 102, and as such may be implemented by one or more CPU cores, co-processing circuitry, and the like. The particular construction and capability of CPU 106 is selected according to the application needs of computing system 102, such needs including, at a minimum, the carrying out of the functions described in this document, and also including such other functions as may be executed by system 102. In the architecture of system 102 according to this example, a system memory 112 is coupled to system bus 107, and it provides memory resources of the desired type useful as data memory for storing input data and the results of processing executed by central processing unit 106, as well as program memory for storing the computer instructions to be executed by CPU 106 in carrying out those functions. This memory arrangement is only an example, it being understood that system memory 112 can implement such data memory and program memory in separate physical memory resources, or distributed in whole or in part outside of computing system 102.

System 102 also includes a network interface 114 that is conventional in nature of an interface or adapter by way of which computing system 102 accesses network resources. Inasmuch as system 102 may be a portable device, interface 114 may include various types of radio communication apparatus, including cellular communications, WiFi, Bluetooth, and other known or ascertainable communication protocols and standards. In all events, interface 114 provides system 102 access to network resources, including server 104, which also may be accessible on a smaller (e.g., local area) network, or a wide-area network such as an intranet, a virtual private network, or over the Internet; hence, via those arrangements, various wired and wireless communications may be achieved. In this embodiment, server 104 is a computer system, of a conventional architecture, and as such includes one or more central processing units, system buses, and memory resources, network interface functions, and the like. According to an example embodiment, server 104 includes a program memory 116, which is a computer-readable medium that stores executable computer program instructions, according to which the operations described in this document are executed and so as to communicate information to, and receive information from, computing system 102.

In an example embodiment, computer program instructions are executed by both system 102 and server 104, and distribution of programming and data may be allocated between the two by one skilled in the art, including between the respective memory resources. For example, these data including DUT data, and program instructions may be stored in local system memory resources 112 within system 102, within server 104, program memory 116, database 118, or in network-accessible memory resources to these functions. For example, database 118 may include the simulation model of the DUT, the analog and mixed signal (AMS) co-simulator code or executable itself, simulation test bench models including the stimuli (both codes and equivalent analog quantities like voltages, currents, etc.) and monitors for outputs (both codes and equivalent analog quantities like voltages, currents, etc.). In addition, each of these data and program memory resources can itself be distributed among multiple locations. It is contemplated that those skilled in the art will be readily able to implement the storage and retrieval of the applicable data, computations, and other information useful in connection with example embodiments, in a suitable manner for each particular application.

According to example embodiments, by way of example, system memory 112 and program memory 116 store computer instructions executable by CPU 106 and server 104, respectively, to carry out the functions described in this document. These computer instructions may be in the form of one or more executable programs, or in the form of source code or higher-level code from which one or more executable programs are derived, assembled, interpreted, or compiled. Any one of a number of computer languages or protocols may be used, depending on the manner in which the desired operations are to be performed. For example, these computer instructions for creating and/or testing the DUT according to example embodiments may be written in a conventional high level or test language, either as a conventional linear computer program or arranged for execution in an object-oriented manner, or in numerous other alternatives. These instructions also may be embedded within a higher-level application. Data, including modeling of the DUT, also may be in various formats. For example, the DUT model may be provided in a register-transfer level (RTL) design abstraction, as used in hardware description languages (HDLs), like Verilog and VHSIC hardware description language (VHDL), or a simulation model used for describing analog circuits or analog mixed signal (AMS) circuits (where AMS includes some digital circuits as well). Computer instructions then apply instructions against the DUT model so as to subject the DUT to various input stimuli. In the case of the example embodiments, such stimuli may include, as introduced earlier, either the input values for an analog-input device or the STCS counterpart digital code values for a digital-input device and, as described below, also include injected fault conditions so as to identify those input values or STCS code values.

In any case, those skilled in the art having reference to this description will be readily able to realize, without undue experimentation, example embodiments in a suitable manner for the desired functionality. These executable computer programs and data modeling for carrying out embodiments may be installed in various media. Such media may be resident within system 102 as described above, or alternatively may be in the form of an executable network-based application that is accessible to server 104 and communicable in part or whole to system 102 for receiving inputs from the user, executing algorithms modules at a web server, and providing output to the user at some convenient stored, displayed, or printed form. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions originally may have been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by system 102 in the conventional manner for software installation.

Figure 2A:
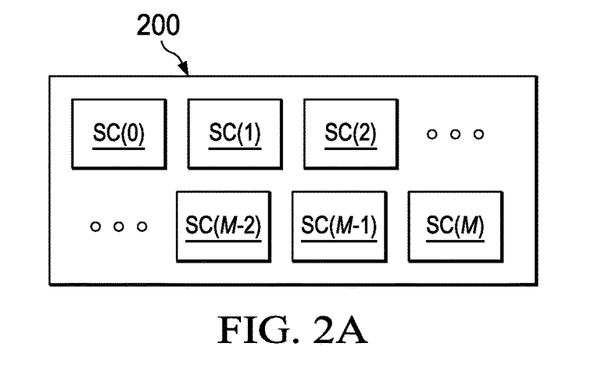
FIG. 2A illustrates spatial and functional considerations in a block diagram of an IC.

FIG. 2A illustrates an IC 200, shown in block diagram, to introduce spatial and functional IC considerations of IC 200, where such considerations are identified in the pre-silicon IC design as realized in the programming of computational system 100. An example embodiment processes such considerations to select portions of the pre-silicon IC design as preferred candidates for testing, followed later by converging on the subset of STCS of the total code set of TCS possible codes for the selected portions, as part of the above-introduced pre-silicon test condition identification. IC 200 includes a number M+1 of sub-circuits, shown as SC(0), SC(1), . . . , SC(M). Each sub-circuit SC(x) is intended to depict an IC design region, characterized based on its spatial positioning (location) on IC 200, or based on its function, including the circuit elements and connectivity. For example and as detailed below, a particular sub-circuit SC(x) may include a set of similarly coupled capacitors (sometimes referred to as a capacitor array or capacitor bank), configured to provide a comparison functionality against an input voltage, as may exist in an ADC. Example embodiments select among the IC sub-circuit(s) those that have a larger relative vulnerability to being operationally defective, as compared to the other IC sub-circuit(s). Such identification may be realized in various forms, including by programming of computational system 100 with both the IC design and information relatable to potential design defects, such as regarding sub-circuit function within an IC, and further in view of observations from semiconductor manufacturing. Indeed, defects in silicon can be many, and it may be impractical, unfeasible, or even impossible to evaluate all of them during pre-silicon validation (by simulation). Further, not all such defects will subsequently manifest as measurable or observable faults during post-silicon testing or operation of the IC. Accordingly, example embodiments converge to identify defects having a relatively higher probability of causing IC operational errors. For example, prior manufacturing of devices may reveal vulnerability of capacitive array proneness to presenting operational defects, where the vulnerability is attributable, for example, to one or more of manufacturing process, circuit layout, circuit location, or other factors. In such an event, an example embodiment selects (or identifies) any sub-circuit SC(x) that includes a capacitor array, as such region is considered to be relatively prone to defect, which herein is termed defect-sensitive. Thereafter and as shown below, the selected defect-sensitive IC region(s) is further processed at the pre-silicon stage to identify a suitable subset of the total code set of TCS possible codes applicable to that region(s), and for later post-silicon testing of the IC that will include the region(s).

Figure 2B:
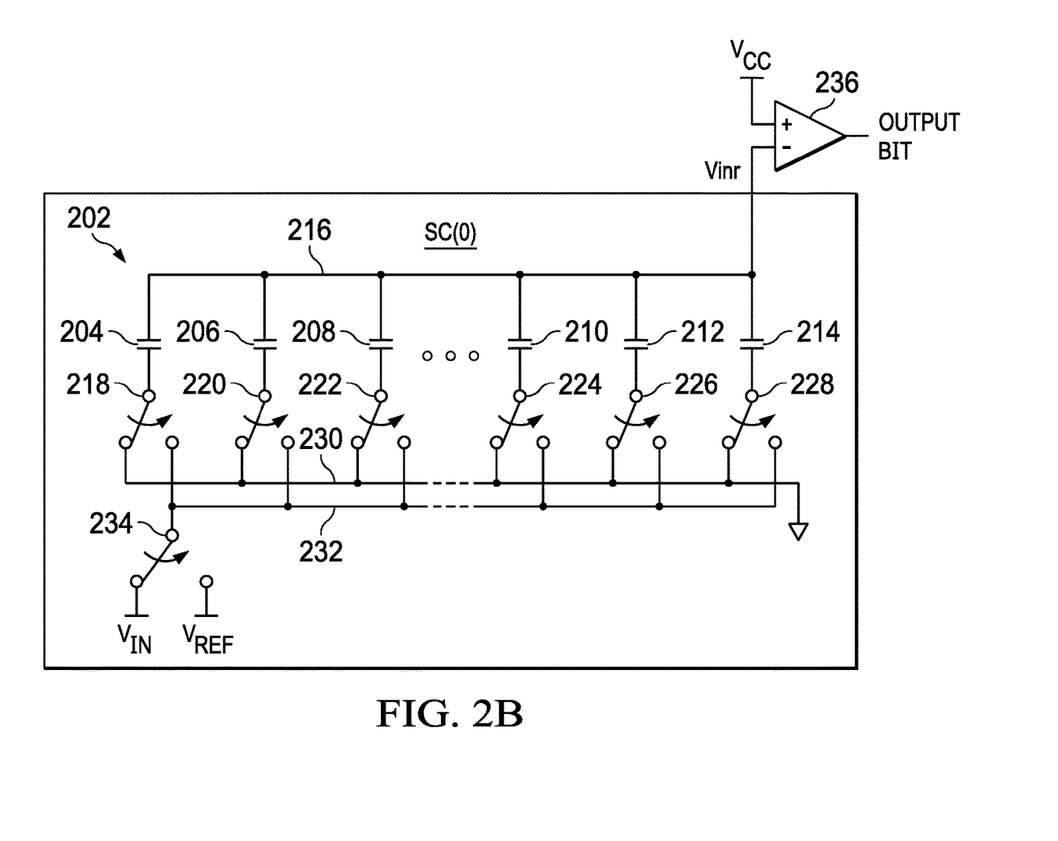
FIG. 2B illustrates a sub-circuit of FIG. 2A, including a successive approximation ADC capacitive array, by way of example.

FIG. 2B illustrates a sub-circuit SC(0) of FIG. 2A, which by way of example includes a capacitor array 202. A capacitive array may be included in various devices. In one example detailed later in FIG. 4, an implementation of a successive approximation register (SAR) ADC may include capacitor array 202 as a DAC, in the sense of digital control of switches in the array providing an analog output Vinr, that is, such a SAR ADC may have an inherent DAC in a feedback path to compare the error against the input. In FIG. 2B, capacitor array 202 includes an array of R individually switched binary-weighted capacitors, shown as capacitors 204 through 214. Each of the capacitors 204-214 has a first plate connected to a voltage node 216 and a second plate to a pole of a respective switch 218 through 228. Each of switches 218 through 228 may be independently operated by a respective control signal (not shown) to switch a respective capacitor lower plate to either a first node 230 or a second node 232. First node 230 is connected to ground, and second node 232 is connected through a voltage-selection switch 234 to receive either an input voltage $v_{IN}$ or a reference voltage $v_{REF}$. Capacitor array 202 outputs Vinr to a comparator 236, which may exist in a different block of the SAR ADC. Comparator 236 has a first input (shown as negative) connected to receive Vinr from node 216 and a second input (shown as positive) connected to an upper voltage level value, $v_{CC}$. Comparator 236 also provides one output bit at a time, where an SAR ADC may successively sample a number of successive comparator output bits to form an additional number of bits in the ADC conversion. Lastly, the capacitance of capacitors 204 through 214 is different, so as to facilitate a comparison function of the ADC, with the following table illustrating the relative capacitance as compared to a based capacitance, C:

TABLE 1

| Capacitor | Capacitance value |
|---|---|
| 204 | C |
| 206 | C/2 |
| 208 | C/4 |

TABLE 1-continued

| Capacitor | Capacitance value |
|---|---|
| . | . |
| . | . |
| . | . |
| 210 | $C/2^{R-3}$ |
| 212 | $C/2^{R-2}$ |
| 214 | $C/2^{R-1}$ |

Table 1 illustrates that each capacitor, after capacitor 204, has one-half the capacitance, and charge storage capability, of another (e.g., next adjacent) capacitor in the array.

The differing capacitive values of array 202, and the switching and comparator functionality, permit array 202 to determine a value of $v_{IN}$ by a binary search as compared to the reference voltage, $v_{REF}$, with further division by relative capacitance and per each comparison iteration, as follows. First, all capacitors 204 through 214 are discharged to an offset voltage (not shown) of comparator 236, providing automatic offset cancellation. Next, switches 218 through 228 are switched to the right relative to the position indicated in in FIG. 2B, while voltage-selection switch 234 is positioned as shown in FIG. 2B, connecting the lower plate of each of capacitors 204 through 214 to the input signal, $v_{IN}$. Accordingly, each capacitor stores a charge equal to its respective capacitance times $v_{IN}$, minus the offset voltage on each capacitor. Next, switches 218 through 228 are switched to what is shown as the left in FIG. 2B, thereby positioning them as shown in FIG. 2B and connecting the lower plates to node 230 (ground), with the total charge across all capacitors 202 through 214 applied to the negative input of comparator 236 and representing the former charge from $v_{IN}$. Finally, a conversion occurs by successively connecting capacitors to $v_{REF}$. Particularly, first, as a most significant bit (MSB), the highest capacitance capacitor 204 is switched (via switches 234 and 218) to $v_{REF}$, which corresponds to the full-scale range of capacitor array 202. Due to the binary-weighting of the array, the MSB capacitor forms a 1:1 charge divider with the rest of the array. Thus, the voltage at node 216, connected to comparator 236, is now $-v_{IN}+v_{REF}/2$. Accordingly, if $v_{IN}$ is greater than $v_{REF}/2$, then comparator 236 outputs a digital 1 as the MSB output bit, otherwise it outputs a digital 0 as the MSB output bit. Each successively lower capacitance capacitor is tested in the same manner for each correspondingly lesser significant bit in the conversion, thereby ultimately converting $v_{IN}$ to a multi-bit digital counterpart output code, with a number of bits determined by the resolution of the DAC.

Given the preceding, for an IC with a sub-circuit such as sub-circuit SC(0), a post-silicon test for that sub-circuit may involve applying a linearly increasing voltage to $v_{IN}$ so as to confirm an output of each possible digital output code from all binary zeroes to all binary ones, with a total code set having TCS=$2^R$ output codes. As demonstrated below, however, example embodiments will determine during the pre-silicon stage a subset of STCS of the full total code set of TCS codes and for use during post-silicon testing, where STCS is less than the total code set of TCS=$2^R$ codes. As also shown, part of that reduction in the number of post-silicon testing codes is informed by data corresponding to principles such as those introduced in FIGS. 2A and 2B, for example with respect to sub-circuit defect sensitivity, which can arise from structure such as shown in FIG. 2B, spatial position by any of the sub-circuits in FIG. 2A, or other considerations.

Figure 3:
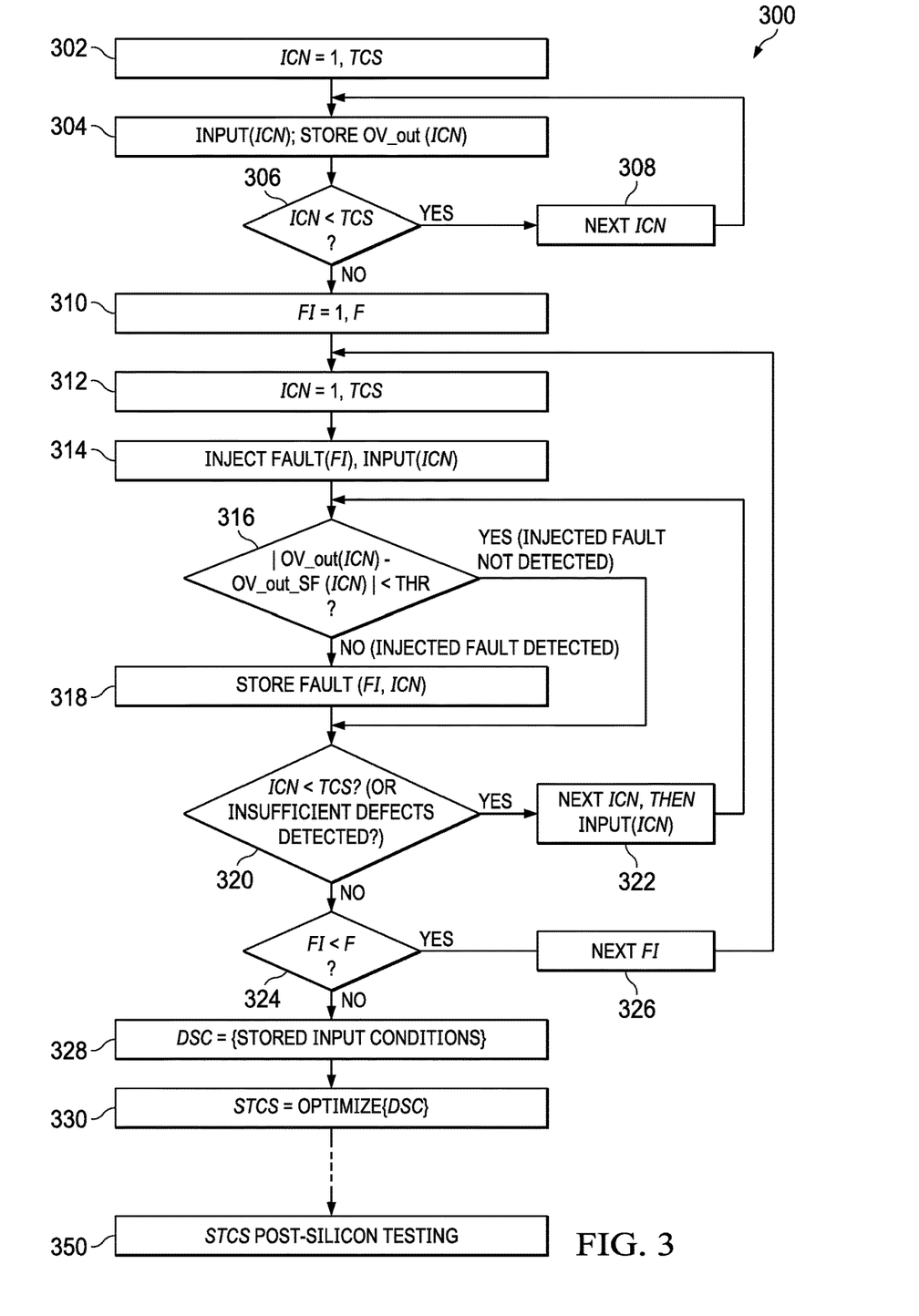
FIG. 3 illustrates a flowchart of an example embodiment process flow including pre-silicon and post-silicon testing of the DUT.

FIG. 3 illustrates a flowchart of an example embodiment method 300, as may be performed by system 100 to include pre-silicon test condition identification of a DUT. The DUT for pre-silicon verification is not the physical device, but rather is the pre-silicon device simulation model, that is, the DUT exists in a tangible form in the sense of a device storing data modeling the DUT, the modeling characterizing the DUT as it is to be implemented in silicon. As introduction, method 300 includes, and may be further introduced, by two process descriptors: (i) fault injection; and (ii) incremental analysis. Each is described below.

Fault injection sequentially imparts a total number F of different faults modelled into the DUT design model. Selection of the particular set of injected faults is informed by the defect-sensitivity process described above. For a very simple example, consider the structural connectivity in a DUT with three nodes. In such a case, a fault can occur between any combination of two of those three nodes and on each node standalone, leaving a total of F=6 different inter-node paths along or intra-node points at which a fault may occur. Accordingly, method 300 fault injection iteratively imposes a respective simulated fault for each of the F different fault possibilities. As a more complex example, consider DAC 202 of FIG. 2B as the DUT (or relevant portion, either spatially in FIG. 2A or functionally as a DAC). Various different faults could occur in such a DUT, including but not limited to the following:

Opens in the capacitor terminals.
Shorts across the capacitor.
Switches stuck to one of two (or more) positions.
Short across the comparator inputs.
Opens at the comparator input terminals
Open at the comparator output.
Opens in the ADC module terminals (or pins).
Shorts across adjacent module terminals.

Faults also may arise due to semiconductor fabrication attributes of the circuit. Still further, in a more complex example such as the preceding, F may be increased to include any one or more of these potential faults.

Incremental analysis stimulates the DUT (or a portion thereof) across a range of input conditions. The input condition stimulus for each increment corresponds to each of the entire TCS number of codes. For example, if the DUT is one to accept the code as an input (e.g., DAC circuit), then incremental analysis is applied by iteratively applying each of the different TCS codes as an input condition, while concurrently observing the corresponding analog output signal (e.g., voltage, current, frequency, delay, or temperature, pressure, etc.). Conversely, if the DUT is one to output the code (e.g., ADC circuit), then incremental analysis is applied by iteratively applying each different level, for example linearly, of a corresponding analog input signal condition (e.g., voltage, current, frequency, delay, temperature, pressure, etc.), while concurrently observing the corresponding digital output code.

Given the preceding and as detailed below, method 300 combines the fault injection and incremental analysis, so as to evaluate the entire TCS number of codes (either as inputs or outputs), per injected fault. Further, method 300 processes the evaluation results to select the subset of STCS codes from the full total set of TCS codes. Later, therefore, the subset of STCS codes are usable by example embodiments for use during post-silicon testing of a physical DUT that corresponds to the simulated DUT used during method 300.

Method 300 starts with an initialization step 302 that sets an integer index ICN to a value of one, where the ICN index is so named as it is used as an advancing loop control for each different input condition. The input condition indexed by ICN may be a code, voltage, current, frequency, delay, temperature, pressure, etc., up to a total of TCS loops, corresponding to the total number of TCS digital codes applicable to the tested portion of the DUT (either as inputs or outputs). Next, method 300 continues from step 302 to step 304.

Step 304 couples an input value INPUT(ICN) to the DUT, again in the sense of system 100 applying a simulated input condition stimuli to the DUT circuit model. The convention of showing the input value as INPUT(ICN) is intended to demonstrate it is indexed based on the current value of ICN. Accordingly, the first loop of step 304 applies INPUT(1), the second loop applies INPUT(2), and so forth. In this manner, for each different value (loop) of ICN, a different input condition stimulus is applied to the DUT and intended to create a different respective output. For an example of an ADC, each different input condition is an analog voltage, and each corresponding output is one of the TCS digital codes. As another example, for a digitally controlled oscillator (DCO), each different input condition is one of the TCS digital codes, and each corresponding output is a different frequency. Additionally, while INPUT(1), INPUT(2), and so forth, denote different inputs, they need not denote sequential inputs. For example, INPUT(1), being the lowest possible input, could correspond to an output code of a binary zero, while INPUT(2) could correspond to an output code of a binary one, although it is not necessary that INPUT(2) must sequentially follow INPUT(1). Those knowledgeable with the design can choose, for example a code from the total possible TCS digital codes, and this selection is not necessarily numerically sequenced, for the total number TCS of possible codes, as either DUT inputs or outputs. Also in step 304, for each INPUT(ICN), a corresponding output from the DUT is captured and stored as an output value OV_out(ICN) is stored, where again the value can be a code, voltage, current, frequency, delay, or temperature, depending on the type of DUT and the condition that is input to the DUT. Next, method 300 continues from step 304 to step 306.

Step 306 is a conditional check on the loop index ICN, comparing it to the total number of TCS codes. If ICN is less than TCS, method 300 proceeds to step 308 to advance (e.g., increment) the ICN index to its next value, and control returns to step 304 to repeat for the advanced ICN index. If ICN is not less than TCS, then method 300 continues from step 306 to step 310. Additionally, incremental advancement of ICN is not necessarily sequential, but is intended to illustrate advancing to input a next one of the TCS conditions. For example, ICN may advance (or change) in an order selected in one of three ways: (i) increment/decrement sequentially, (ii) randomly, (iii) intelligently, for example, based on defect based testing, so as to potentially fully detect the subset STCS of the full total code set TCS prior to testing all TCS codes. Lastly, if ICN is advanced in a manner other than sequentially, then the condition of step 306 is modified accordingly, so as to determine if a sufficient number of input values, of the total TCS, have been tested.

Step 310 is an initialization step that sets an integer index FI to a value of one, where the FI index is so named as it used as an advancing loop control for a total of F loops, again where F is the number of possible faults that will be injected in the DUT during the pre-silicon steps of method 300. As shown by examples and discussion above, the actual value of F can depend on manufacturing processes, circuit location on an IC, circuit structure or functional complexity, as well as types of faults being tested. Next, method 300 continues from step 310 to step 312.

Step 312 is the same as step 302, that is, to initialize and control an ICN loop counter, but here the nesting location of the step is to control the recurrence of a loop beneath it. As shown below, this additional loop, combined with the step 310 FI index, generally allows a total of TCS input conditions to be applied for each of F different possible faults. Next, method 300 continues from step 312 to step 314.

Step 314 applies an indexed one of the different TCS input condition values to the DUT, for the FI indexed one of the F possible node faults. For example, for the first instance of step 314 (FI=1; ICN=1), a first injected fault FAULT(1) is simulated into the DUT and a first input condition INPUT(1) is then input to the fault-injected DUT. For this and other instances of step 314, the injected fault may be selected by one skilled in the art, simulating a DUT defect. For example, one approach is to insert a resistance between two nodes other than what exists in the specified (or nominal) DUT design. For instance, an inserted low resistance (e.g., under 10 Ohms) can simulate a short-circuit between the two nodes, or an inserted high resistance (e.g., above 100 Mega Ohms) can simulate an open circuit between the nodes or an open circuit inline within the node, which can be a fault if there otherwise is some connectivity between the nodes under the nominal DUT design or a connection between the node start point and the node termination point. Other faults also may be injected, for example to simulate the possible faults observed above with respect to sub-circuit SC(0). Next, method 300 continues from step 314 to step 316.

Step 316 compares a no-fault DUT output with an injected fault output, as is now explained. Specifically, recall that step 304 previously stored an output value OV_out(ICN) for each input condition value applied to the DUT, with each such value indexed by ICN. Hence, the step 304 stored values represent no fault operation of the DUT, assuming there is no error in the DUT design. In contrast, step 316 intentionally injects a fault (selected by index FI) to the DUT, and applies an input condition value (indicated by index ICN) to the DUT under the index FI fault condition. Summarizing, therefore, step 304 provides an expected no-fault output, while step 316 provides an output under a simulated fault "SF" from the injected fault. For reference, the step 316 simulated fault output is referred to herein with the SF indicator, as output value OV_out_SF(ICN). With these observations, step 316 compares OV_out(ICN) and OV_out_SF(ICN) to determine if they are relatively close to one another, for example by comparing an absolute value of the difference between the two to a threshold THR. Threshold THR may be predetermined by a test engineer or the like, so as to allow some tolerance in the step 316 comparison and not requiring an exact match between the compared values. Accordingly, if the threshold THR is relatively small, and if the difference is below the threshold THR, then OV_out (ICN) and OV_out_SF(ICN) are close to another (closer than threshold THR), then method 300 advances from step 316 to step 320. To the contrary, but also for the same threshold THR, if the difference is not below the threshold THR, then OV_out(INC) and OV_out_SF(ICN) are not close to another, then method 300 continues from step 318 to step 320. Each of these alternatives is discussed below.

Step 318 is reached, as discussed above, when no-fault (as designed) DUT output value OV_out(ICN) is sufficiently different (beyond threshold THR) from the DUT simulated fault output value OV_out_SF(ICN). The example embodiment concludes, therefore, that such a result implies that the injected fault caused a different output value than what would be expected for the given input value, if there were no injected fault. Accordingly, because the output differs than what would be expected from the no-fault occurrence (as determined from step 304), the code that is either provided by the output, or that was input to provide the counterpart output analog signal, is deemed by an example embodiment as one that can predict or identity the existence of a defect, where here the defect is the injected fault but of course where the same, or a similar defect, could occur in the DUT once manufactured. Accordingly, step 318 stores the injected fault that was imposed (as indicated by index FI) and detected, and it also stores the input condition that caused the undetected fault (as indicated by index ICN). Accordingly, for an ADC, the input condition is an input voltage (with an allowed range that includes that input voltage and corresponds to an output digital code), whereas for a DAC, the input condition is the code that was an input or an output. Next, method 300 continues from step 318 to step 320.

Having described the code storage of a flow from step 316 to step 318, when the simulated injected fault is detected, the alternative flow from step 316 to 320 is again noted, when the simulated fault is not detected. Specifically, in that instance, recall that step 316 produces a result that the output value OV_out_SF(ICN) for the given injected fault input condition is sufficiently close to what it was (OV_out(ICN)) when no fault was injected. Such an instance is described herein as an output undetected fault, because the DUT output did not change materially (beyond THR) in response to the injected fault. Hence, the code, as either input or output in that iteration, was not sensitive to the existence of the injected fault, that is, the fault was not detected as corresponding to that code. Accordingly, step 318 is bypassed in that instance, and the code is not stored as it is deemed one not sufficiently sensitive to the detecting the injected fault. Given this alternative flow, note that step 318 selectively stores only those codes that are either the input or output value when an input condition (either analog, or the code itself) causes the DUT to output a counterpart value that is different, beyond a threshold, than a no-fault output for the input condition.

Step 320 can be reached from step 316 or from step 318. In either event, step 320 is the same as step 306, albeit at a different location in the sequence, thereby providing a conditional check on the loop index ICN by comparing it to the total number of (either input or output) TCS codes. If ICN is less than TCS, then method 300 proceeds to step 322 to advance (e.g., increment) the ICN index to its next value and apply that next input INPUT(ICN), and control returns to step 316 to repeat for the advanced ICN index. If ICN has reached TCS, then method 300 continues from step 320 to step 324. Alternatively, this loop may be terminated if there are a sufficient number of injected faults that, by this point in the loop, have been detected. For example, in an alternative embodiment, if the number of codes stored by previous occurrences of step 318 indicates a sufficient number of thus-far detected injected faults, this loop can be terminated. Hence, the thus-far stored number of codes may be compared to a threshold, for instance, whether the total number detected, divided by F. Once step 320 is no longer satisfied, method 300 continues from step 320 to step 324.

Step 324 is a conditional check on the loop index FI, comparing it to the total F number of potential injected faults. If FI is less than F, then method 300 proceeds to step 326 to advance (e.g., increment) the FI index to its next value, and control returns to step 312 to repeat for the advanced FI index. If FI has reached F, then method 300 continues from step 324 to step 328.

Once method 300 reaches step 328, note that a number of input conditions (or a corresponding index ICN for same)

have been stored. The stored input conditions (or corresponding indices) are either codes that were input to a digital-to-analog converter DUT while an injected fault to the DUT was detected, or were analog inputs corresponding to codes that were output from an analog-to-digital converter DUT while an injected fault was detected. Thus, not all TCS input conditions will result in detected injected faults, but step 328 will include a lesser number than TCS, with that lesser number being those input conditions that correspond to detected faults. Accordingly, this lesser number, in an example embodiment, is a set of input conditions corresponding to defect sensitive codes having an integer number DSC of such codes. These DSC codes may be used for post-silicon testing of the DUT, since the DSC codes were attributable to defect detection during pre-silicon fault injection. However, in an example embodiment, method 300 continues from step 328 to step 330, where the DSC input conditions may be further reduced.

In step 330, the DSC input conditions may be further reduced using an incremental optimization analysis using the DSC input conditions as a precursor set that is further reduced to a final input set of post-silicon test conditions. Particularly, with method 300 having thus far reduced possible test input conditions from TCS to DSC, step 330 further optimizes the possible post-silicon test conditions by eliminating some of the DSC input conditions, leaving a final test set of STCS input conditions. Accordingly, step 330 identifies one or more subsets of the DSC input conditions, where the identified subset(s) has a number STCS (with STCS<DSC) of input conditions that still will detect a maximum, if not all, of the number of faults injected during preceding steps of method 300. Such reduction may be achieved using any of various methods, from a greedy heuristic to more advanced algorithms, based upon various searching and sorting techniques across the input condition space, which have been prominently applied, e.g. to identify the minimum set of minterms which cover all prime implicants in logic synthesis, to identify the minimum set of ATPG (automatic test pattern generation) tool based patterns which cover all detected faults for digital circuits, etc. Other approaches may compare adjacent input conditions, compare all pairs of input conditions, compare some subset of input conditions, etc. to arrive at the smallest number of input conditions that covers all (or some predetermined threshold number of) defects. At some point following step 330, method 300 will conclude in step 350.

In a later step 350, an example embodiment tests the DUT in its post-silicon form. The post-silicon test uses only the subset STCS of the full total number of TCS input conditions, either with those STCS input conditions as digital codes inputs, or by inputting the analog condition corresponding to each of STCS codes as outputs. Note that such post-silicon testing can also be with appropriate connectivity to system 100, or separately in other testing environments. Accordingly, post-silicon testing may be achieved for a device having a resolution of N, and therefore a corresponding total of $2^N$ possible input conditions under full linear testing, with a far lesser number of STCS input conditions. Further, the reduced input condition set achieves a comparable post-silicon testing fault-detection level to that of prior art full linear testing.

Figure 4:
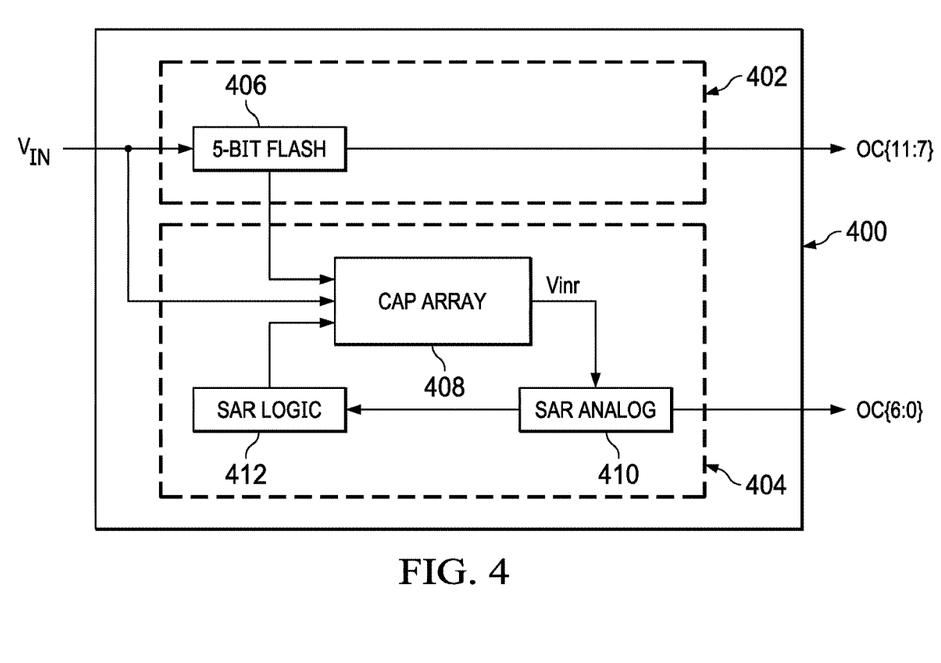
FIG. 4 illustrates a block diagram of an example DUT that may be pre-silicon and post-silicon tested per example embodiments.

FIG. 4 illustrates a block diagram of an example DUT 400 that may be pre-silicon processed for determining a subset of STCS codes from a larger total possible set of TCS codes, and once the STCS codes are determined they also may be used to test DUT 400 once it is manufactured into post-silicon form. In the example of FIG. 4, DUT 400 is an SAR ADC. DUT 400 includes a 5-bit coarse most significant bit (MSB) conversion stage 402 and a 7-bit SAR least significant bit (LSB) conversion stage 404. Generally the DUT, as an SAR ADC, converts an analog input voltage, $v_{IN}$, into an N-bit digital output (here, N=12), using in part a binary search through possible digital output quantization levels. Thus, were DUT 400 post-silicon tested per prior art full linear testing, such testing would require iterative testing for a total code set having $TCS=2^{N=12}$ codes, whereas example embodiments facilitate testing at a lesser subset of STCS codes.

With respect to MSB conversion stage 402, $v_{IN}$ is connected thereto and this stage generates 5 bit coarse binary output which are output in FIG. 4 as most significant output code bits OC{11:7}. This stage also converts this binary coded output to a thermometric coded output which is fed to capacitor array 408, which in some respects may be implemented as capacitor array 202 in FIG. 2B. Capacitor array 408 also receives ADC input voltage, $v_{IN}$ and generates residual voltage Vinr not representable by the five most significant bits. Further this residue is fed into a SAR stage 404, which has an SAR analog block 410 that may include a comparator (e.g., comparator 236 of FIG. 2B), under control of and with feedback to SAR logic 412, resolves remaining 7 bits using a successive approximation conversion method as described in the following. Successive approximation typically involves successive clock cycles, typically requiring one clock cycle per output bit. In each clock cycle, the input voltage (here, Vinr) is compared to a per clock cycle successively altered reference voltage, so as to determine whether the input voltage is above or below the changing reference, thereby converging on the relative value of the input to the value represented by each of the SAR output bits. In this manner for the example of FIG. 4, SAR analog block 410 outputs the seven LSBs, which are then output in FIG. 4 as less significant output code bits OC{6:0}.

Given the preceding, DUT 400 provides an N=12 bit digital output code, in response to an analog input voltage $v_{IN}$. Accordingly, DUT 400 includes analog to digital conversion that may be pre-silicon analyzed to identify a subset of STCS defect sensitive codes, and then later post-silicon tested with those codes, according to method 300. Method 300 is not limited to SAR ADCs, although the SAR construction can be relevant, as an example, to a manner of one skilled in the art selecting the various F possible faults to be injected as part of the method and identifying input test conditions to detect such faults.

Figure 5:
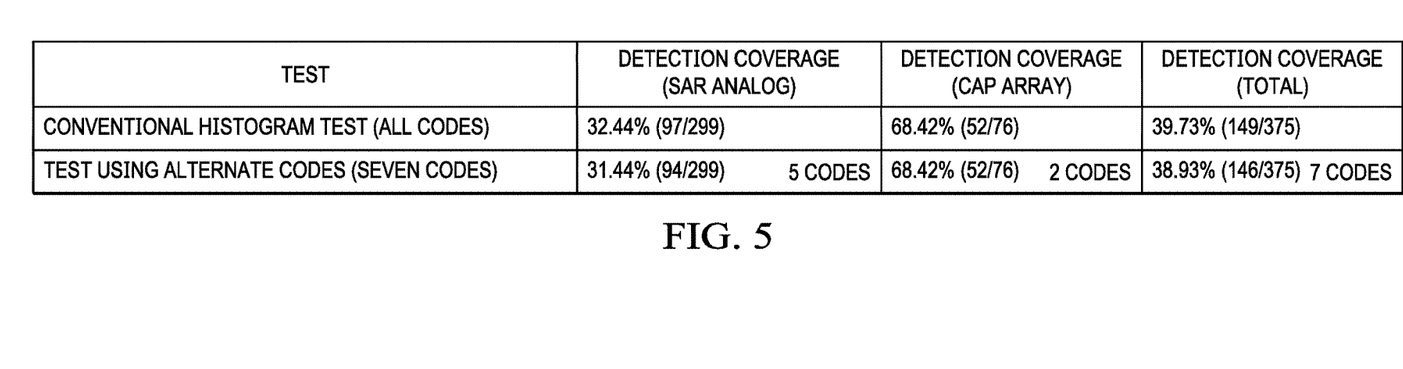
FIG. 5 contrasts the fault detection results from applied DUT stimuli in a conventional linear histogram versus an example embodiment subset of analog input values for an ADC.

FIG. 5 illustrates a table contrasting the results of testing DUT 400 with different input stimuli testing. The FIG. 5 second row depicts testing results for a conventional linear histogram input of all $2^{12}=4,096$ codes. The FIG. 5 third row depicts testing results for an example embodiment input of a number of analog inputs corresponding to an optimal number of STCS=7 output codes, as identified in method 300. The particular choice of which STCS=7 analog input values (corresponding to output codes) is dependent upon the how the method 300 is applied. Multiple such input values/code subset combinations can exist which give the best coverage, where one such subset is depicted in FIG. 5. Also in FIG. 5, an error (e.g., integral nonlinearity ("INL")) of two least significant bits is permitted, meaning the last two bits of the N=12 bits of DUT 400 are not considered for evaluating accuracy.

The FIG. 5 second row indicates detection coverage from conventional testing, the results shown as faults detected and corresponding percentages for SAR analog block 410 (second column) and capacitor array 408 (third column). The second row, second column parenthetical indicates that out of a total of 299 possible faults, 97 are detected using all codes from a conventional histogram test, yielding a 32.44% fault detection (100%*97/299=32.44%). The second row, third column parenthetical indicates that out of a total of 76 possible faults, 52 are detected using all codes from a conventional histogram test, yielding a 68.42% fault detection (100%*52/76=68.42%). The final column totals these results, indicating parenthetically that out of a total of 375 possible faults, 149 are detected, yielding a total fault detection of 39.73% using all codes.

The FIG. 5 third row indicates detection coverage from example embodiment testing, the results again shown as faults detected and corresponding percentages for SAR analog block 410 (second column) and capacitor array 408 (third column). Using an example embodiment, the second row, third column parenthetical indicates that out of the same total of 299 possible faults, 94 are detected using only five of the total seven codes identified by method 300, yielding a 31.44% fault detection (100%*94/299=31.44%) which, therefore, in only one percent less than the conventional histogram test shown in the second row. Still further, the third row, third column parenthetical indicates an identical fault detection rate to that of the second row conventional approach, that is, out of a total of 76 possible faults, 52 are detected using only two of the seven codes identified by method 300, yielding the same 68.42% fault detection (100%*52/76=68.42%). Hence, the combined final column of the third row indicates parenthetically that out of a total of 375 possible faults, 146 are detected, using a total of only seven codes identified by method 300, yielding a total fault detection of 38.93%, or less than a one percent drop from a full conventional histogram test.

From the above, one skilled in the art should appreciate that example embodiments are provided for pre-silicon code identification and post-silicon testing of a DUT. Example embodiments have shown that the pre-silicon code identification can considerably reduce resource usage for post-silicon testing of a DUT, particularly for example in comparison to traditional full-linear post-silicon testing. Resultant post-silicon testing may be improved to an efficacy that will exceed standards in certain instances, for example with a permitted tolerance measured in a relatively small number of least significant bits of the DUT analog-to-digital portion providing a digital output. Example embodiments have application to identify an optimal test code set for various types of data converters, insofar as the converter includes a digital code set as either inputs or outputs, and to provide an acceptably high, same, or comparable defect coverage as compared to techniques requiring a larger of post-silicon test iterations. And, the optimal test set can provide an effective low cost alternative to other tests that require a larger number of input test set stimuli, with full linearity as one example. Still further, example embodiments may be extended to drive target based tests that in turn lead to efficient and pattern directed analog built-in self-test (BIST) techniques.

Additionally, method 300 as described may be implemented with variants. Some variants can involve a) pre-ordering of the code or fault space based on design insight, historical information or the fabrication process information; b) incremental analysis that either (i) removes the faults already detected during preceding iterations from the fault set used for subsequent iterations; or (ii) swaps the inner and outer loops that steps through the input stimuli set and fault set respectively and removes the input stimuli or codes already detected during preceding iterations from the stimuli or code set used for subsequent iterations; and c) avoiding or using a modified incremental optimization analysis process to make use of the incremental nature of preceding analysis and the stored code set from such an analysis outcome being optimal to a certain degree. Such variants may accommodate a complex circuit analysis and balance between targeted optimization and incremental analyses cost. Accordingly, additional modifications are possible in the described embodiments, and other embodiments are possible, within the scope of the following claims.

What is claimed is:

1. A method of operating a computational system to evaluate a device under test, the device under test operable to receive a digital code input and output in response a corresponding output, the method comprising:
    injecting a plurality of simulated faults into a pre-silicon model of the device under test;
    for each injected simulated fault:
        inputting a plurality of digital codes to the pre-silicon model of the device under test; and
        for each input digital code, selectively storing the input digital code if a difference, between a corresponding output for the input digital code and a no-fault output for the input digital code, exceeds a predetermined threshold value.

2. The method of claim 1 wherein each input digital code represents a value selected from a set consisting of current, frequency, delay, temperature, or pressure.

3. The method of claim 1 wherein the device under test comprises a digital input having N bits.

4. The method of claim 3 wherein the set of digital codes comprises $2^N$ or less codes.

5. The method of claim 4 wherein a total of stored input digital codes is less than a total of the set of digital codes.

6. The method of claim 1 wherein the device under test is a digitally controlled oscillator (DCO).

7. The method of claim 1 and further comprising identifying the plurality of simulated faults in response to structural connectivity of the device under test.

8. The method of claim 1 and further comprising identifying the plurality of simulated faults in response to semiconductor fabrication attributes of the device under test.

9. The method of claim 1 and further comprising testing the device under test in post-silicon form with respect to the selectively stored input digital codes.

10. The method of claim 1 and further comprising testing the device under test in post-silicon form with respect to a subset of the selectively stored input digital codes.

11. The method of claim 1 wherein each input digital code represents a value selected from a voltage.

12. The method of claim 1 wherein the device under test is a digital-to-analog converter.

13. A non-transitory computer-readable program storage medium having stored thereon program instructions that when executed by a processor have the processor capable of:
    simulating a device under test, the device under test operable to receive a digital code input and output in response a corresponding output;
    injecting a plurality of simulated faults into a pre-silicon model of the device under test;
    for each injected simulated fault:
        inputting a plurality of digital codes to the pre-silicon model of the device under test; and
        for each input digital code, selectively storing the input digital code if a difference, between a corresponding output for the input digital code and a no-fault output for the input digital code, exceeds a predetermined threshold value.

14. A method of operating a computational system to evaluate a device under test, the device under test operable with respect to receive an analog value input and output in response a digital code from among a set of digital codes, the method comprising:
 injecting a plurality of simulated faults into a pre-silicon model of the device under test;
 for each injected simulated fault:
  inputting a plurality of analog values to the pre-silicon model of the device under test; and
  for each input analog value, selectively storing a representation of the input value if a difference, between a corresponding digital code output for the input analog value and a no-fault digital code output for the input analog value, exceeds a predetermined threshold value.

15. The method of claim 14 wherein each input analog value represents a value selected from a set consisting of voltage, current, frequency, delay, or temperature.

16. The method of claim 14 wherein the device under test comprises a digital output having N bits.

17. The method of claim 16 wherein the set of digital codes comprises $2^N$ or less codes.

18. The method of claim 17 wherein a total of stored representations of input values is less than a total of the set of digital codes.

19. The method of claim 14 wherein the device under test is selected from a set consisting of an analog-to-digital converter, a voltage-controlled oscillator, and a current controlled oscillator.

20. The method of claim 14 and further comprising identifying the plurality of simulated faults in response to structural connectivity of the device under test.

21. The method of claim 14 and further comprising identifying the plurality of simulated faults in response to semiconductor fabrication attributes of the device under test.

22. The method of claim 14 and further comprising testing the device under test in post-silicon form with respect to the selectively stored input values.

23. The method of claim 14 and further comprising testing the device under test in post-silicon form with respect to a subset of the selectively stored input values.

24. A method of operating a computational system to evaluate a device under test, the device operable with respect to a set of digital codes as either a set of device inputs or a set of device outputs, the method comprising:
 fault injection of a plurality of simulated faults into a pre-silicon model of the device under test;
 incremental analysis for each injected simulated fault by:
  inputting a plurality of conditions as inputs to the pre-silicon model of the device under test; and
  for each input condition, selectively storing the input condition if a difference, between a corresponding output for the input condition and a no-fault output for the input condition, exceeds a predetermined threshold value.

25. The method of claim 24 wherein each input condition comprises an analog signal and each corresponding output comprises a digital code.

26. The method of claim 24 wherein each input condition comprises a digital code and each corresponding output comprises an analog signal.

27. A non-transitory computer-readable program storage medium having stored thereon program instructions that when executed by a processor have the processor capable of:
 simulating a device under test, the device under test operable to receive an analog value input and output in response a digital code from among a set of digital codes;
 injecting a plurality of simulated faults into a pre-silicon model of the device under test;
 for each injected simulated fault:
  inputting a plurality of analog values to the model; and
  for each input analog value, selectively storing a representation of the input value if a difference, between a corresponding digital code output for the input analog value and a no-fault digital code output for the input analog value, exceeds a predetermined threshold value.

28. A method of operating a computational system to evaluate a device under test, the device operable with respect to a set of digital codes as either a set of device inputs or a set of device outputs, the method comprising:
 inputting a plurality of input conditions into a pre-silicon model of the device under test, each input condition in the plurality of conditions either comprising an input code in the set of digital codes or corresponding to a counterpart output code in the set of digital codes;
 for each input condition in the plurality of input conditions, storing a corresponding no-fault output, from the pre-silicon model of the device under test, for the input condition;
 injecting a plurality of simulated faults into the pre-silicon model of the device under test;
 for each injected simulated fault:
  inputting the plurality of conditions as inputs to the pre-silicon model of the device under test; and
  for each input condition in the plurality of conditions, selectively storing the input condition, if an output corresponding to the input condition is different, beyond a threshold, as compared to the no-fault output for the input condition.

* * * * *